US008633747B2

(12) United States Patent
Shin

(10) Patent No.: US 8,633,747 B2
(45) Date of Patent: *Jan. 21, 2014

(54) SYNCHRONIZATION CIRCUIT

(75) Inventor: Dong Suk Shin, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 100 days.

This patent is subject to a terminal disclaimer.

(21) Appl. No.: 13/219,621

(22) Filed: Aug. 27, 2011

(65) Prior Publication Data

US 2012/0194241 A1    Aug. 2, 2012

(30) Foreign Application Priority Data

Jan. 31, 2011    (KR) ........................ 10-2011-0009270

(51) Int. Cl.
*H03L 7/06*    (2006.01)

(52) U.S. Cl.
USPC ......................................... 327/158; 327/149

(58) Field of Classification Search
USPC .................................................. 327/147, 158
See application file for complete search history.

(56) References Cited

U.S. PATENT DOCUMENTS

| | | | | |
|---|---|---|---|---|
| 8,049,543 | B2 * | 11/2011 | Kang et al. | 327/158 |
| 2005/0024107 | A1 * | 2/2005 | Takai et al. | 327/158 |
| 2008/0089459 | A1 * | 4/2008 | Vlasenko et al. | 375/376 |
| 2010/0194456 | A1 * | 8/2010 | Kang et al. | 327/158 |
| 2011/0074479 | A1 * | 3/2011 | Yun et al. | 327/158 |
| 2011/0279156 | A1 * | 11/2011 | Abbasi et al. | 327/158 |
| 2012/0081161 | A1 * | 4/2012 | Shin | 327/158 |
| 2012/0194241 | A1 * | 8/2012 | Shin | 327/158 |
| 2013/0003483 | A1 * | 1/2013 | Vlasenko et al. | 365/230.02 |

FOREIGN PATENT DOCUMENTS

| | | |
|---|---|---|
| JP | 2000-59210 A | 2/2000 |
| KR | 100728472 B1 | 6/2007 |
| KR | 10-0808055 B1 | 2/2008 |
| KR | 10-2009-0071892 A | 7/2009 |

OTHER PUBLICATIONS

Dongsuk Shin, Frequency-independent Fast-lock Register-controlled DLL with Wide-range Duty cycle Adjuster, Icheon, Korea.
Jinn-Shyan Wang, An Ultra-Low-Power Fast-Lock-in Small-Jitter All-Digital DLL, ISSCC Dig. Tech. Papers, 2005, pp. 422-423, Chia-Yi, Taiwan.
Taesung Kim, Fast locking delay-locked loop using initial delay measurement, IEE Electronics Letters, Aug. 15, 2002, pp. 950-951, vol. 38 No. 17.
Y. C. Jang, CMOS digital duty cycle correction circuit for multiphase clock, IEE Electronics Letters, Sep. 18, 2003, pp. 1383-1384, vol. 39 No. 19.
Inhwa Jung, A 0.004-mm2 Portable Multiphase Clock Generator Tile for 1.2-GHz RISC Microprocessor, IEEE Transactions on Circuits and Systems II, Feb. 2008, pp. 116-120, vol. 55 No. 2.

* cited by examiner

*Primary Examiner* — Adam Houston
(74) *Attorney, Agent, or Firm* — William Park & Associates Patent Ltd.

(57) ABSTRACT

A synchronization circuit includes a first delay unit configured to delay an input signal by a delay time corresponding to first initial delay information and generate a pre-delayed signal; a second delay unit configured to delay the pre-delayed signal by a delay time corresponding to second initial delay information and generate a delayed signal; and an initial delay monitoring circuit configured to generate the first initial delay information and the second initial delay information in response to internal delayed signals of the first delay unit and the input signal.

23 Claims, 8 Drawing Sheets

US 8,633,747 B2

SYNCHRONIZATION CIRCUIT

CROSS-REFERENCES TO RELATED APPLICATION

The present application claims priority under 35 U.S.C. §119(a) to Korean application number 10-2011-0009270, filed on Jan. 31, 2011, in the Korean Intellectual Property Office, which is incorporated herein by reference in its entirety as set forth in full.

BACKGROUND

1. Technical Field

The present invention relates generally to a semiconductor circuit, and more particularly, to a synchronization circuit.

2. Related Art

A semiconductor circuit may include a synchronization circuit for delay locking or duty cycle compensation, such as a DLL (delay locked loop) or a DCC (duty cycle corrector).

The delay locked loop may be used to change the phase of a clock signal, usually to improve, for example, the clock rise-to-data output valid timing characteristics of integrated circuits such as DRAM devices.

The duty cycle corrector may be used to compensate for a skew in a duty cycle of a clock signal.

In order to accommodate the trend of a semiconductor integrated circuit toward high speed operation, it is preferred that a delay locking operation and a duty cycle correcting operation be performed as quick and precise as possible.

SUMMARY

A synchronization circuit which can not only shorten a time required for a delay locking operation but also shorten a time required for a duty cycle compensating operation is described herein.

In an embodiment of the present invention, a synchronization circuit includes: a first delay unit configured to delay an input signal by a delay time corresponding to first initial delay information and generate a pre-delayed signal; a second delay unit configured to delay the pre-delayed signal by a delay time corresponding to second initial delay information and generate a delayed signal; and an initial delay monitoring circuit configured to generate the first initial delay information and the second initial delay information in response to internal delayed signals of the first delay unit and the input signal.

In an embodiment of the present invention, a synchronization circuit includes: a first loop circuit configured to change a delay time of a first input signal in response to first coarse initial delay information and fine initial delay information, and generate a first delayed signal; a second loop circuit configured to change a delay time of a second input signal by a preset initial delay time in response to second coarse initial delay information and the fine initial delay information, and generate a second delayed signal; a duty cycle compensation unit configured to compensate for a duty cycle of the first delayed signal using the second delayed signal; and an initial delay monitoring circuit configured to generate the first coarse initial delay information, the second coarse initial delay information and the fine initial delay information in response to internal delayed signals of the first loop circuit and the first input signal.

BRIEF DESCRIPTION OF THE DRAWINGS

Features, aspects, and embodiments are described in conjunction with the attached drawings, in which:

FIG. 2b is a timing diagram of the initial operation setting unit 700 of FIG. 2a;

DETAILED DESCRIPTION

Hereinafter, a synchronization circuit according to the present invention will be described below with reference to the accompanying drawings through exemplary embodiments.

Figure 1:
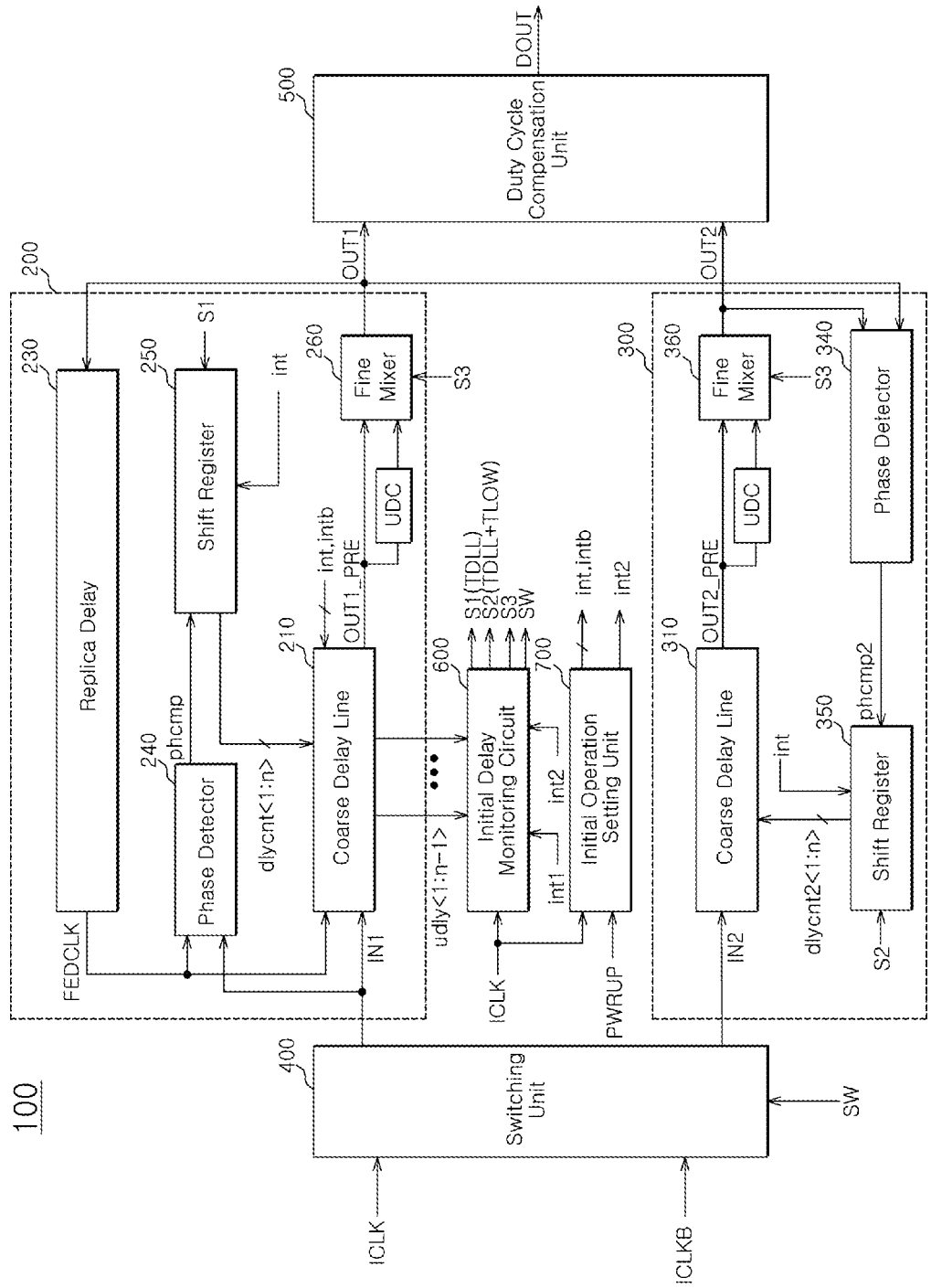
FIG. 1 is a block diagram illustrating a synchronization circuit 100 in accordance with an embodiment of the present invention.

Referring to FIG. 1, a synchronization circuit 100 in accordance with an embodiment of the present invention includes a first loop circuit 200, a second loop circuit 300, a switching unit 400, a duty cycle compensation unit 500, an initial delay monitoring circuit 600, and an initial operation setting unit 700.

A delay locked loop circuit, that is, the first loop circuit 200 is configured to set an initial delay time using first coarse initial delay information S1 and fine initial delay information S3, adjust the delay time of a first input signal IN1, and generate a first delayed signal OUT1.

The first loop circuit 200 includes a first delay unit 210, a replica delay 230, a phase detector 240, a shift register 250, a unit delay UDC, and a second delay unit 260.

The second delay unit 260 is configured to have a unit delay time shorter than that of the first delay unit 210. The first delay unit 210 may be configured as a coarse delay line 210, and the second delay unit 260 may be configured as a fine mixer 260.

As will be described later, a unit delay time means the delay time of each of a plurality of unit delay sections which constitute each of the first delay unit 210 and the second delay unit 260.

The coarse delay line 210 is configured to delay the first input signal IN1 or a feedback signal FEDCLK in response to initial operation period signals int and intb and first delay control signals dlycnt<1:n>, and generate a plurality of unit delayed signals udly<1:n−1> and a first pre-delayed signal OUT1_PRE.

The shift register 250 is configured to generate the first delay control signals dlycnt<1:n> in response to the initial operation period signal int, a phase comparison signal phcmp and the first coarse initial delay information S1.

The unit delay UDC is configured to delay by a unit delay time and output a delayed first pre-delayed signal OUT1_PRE. The unit delay time of the unit delay UDC is set to be the same as the unit delay time of the coarse delay line 210.

The fine mixer 260 is configured to mix the first pre-delayed signal OUT1_PRE and the output signal of the unit delay UDC, i.e. the delayed first pre-delayed signal OUT1_PRE, at a preset mixing ratio in response to the fine initial delay information S3, and generate the first delayed signal OUT1.

The fine mixer 260 bypasses the first pre-delayed signal OUT1_PRE, according to an example, in the case where all bits of the fine initial delay information S3 have low logic levels.

The replica delay 230 is configured to have a preset delay time, that is, a delay time that is acquired by modeling delay times by the delay elements existing on a path through which the first delayed signal OUT1 proceeds to a data output buffer.

The phase detector 240 is configured to compare the phases of the first input signal IN1 and the feedback signal FEDCLK, and generate the phase comparison signal phcmp.

The phase detector 240 may be realized using a flip-flop circuit of an edge trigger type.

A duty cycle compensation loop circuit, that is, the second loop circuit 300 is configured to set an initial delay time using a second coarse initial delay information S2 and the fine initial delay information S3, adjust the delay time of a second input signal IN2, and generate a second delayed signal OUT2 for compensating for the duty cycle of the first delayed signal OUT1.

The second loop circuit 300 includes a coarse delay line 310, a phase detector 340, a shift register 350, a unit delay UDC and a fine mixer 360.

The coarse delay line 310 is configured to delay the second input signal IN2 in response to a second delay control signals dlycnt2<1:n> and generate a second pre-delayed signal OUT2_PRE.

The coarse delay line 310 is configured to have the same unit delay time as the coarse delay line 210.

The unit delay UDC is configured to delay by a unit delay time and output a delayed second pre-delayed signal OUT2_PRE. The unit delay time of the unit delay UDC is set to be the same as the unit delay time of the coarse delay line 310.

The fine mixer 360 is configured to mix the second pre-delayed signal OUT2_PRE and the output signal of the unit delay UDC at a preset mixing ratio in response to the fine initial delay information S3, and generate the second delayed signal OUT2.

The fine mixer 360 bypasses the second pre-delayed signal OUT2_PRE, according to an example, in the case where all bits of the fine initial delay information S3 are logic low.

The phase detector 340 is configured to compare the phases of the first delayed signal OUT1 and the second delayed signal OUT2 and generate a phase comparison signal phcmp2.

The shift register 350 is configured to generate the second delay control signals dlycnt2<1:n> in response to the initial operation period signal int, the phase comparison signal phcmp2 and the second coarse initial delay information S2.

The switching unit 400 is configured to output a clock signal ICLK or a clock bar signal ICLKB as the first input signal IN1 or the second input signal IN2 in response to a switching control signal SW.

The duty cycle compensation unit 500 is configured to compensate for the duty cycle of the first delayed signal OUT1 using the second delayed signal OUT2 and generate a delay-locked and duty cycle-compensated output signal DOUT.

The duty cycle compensation unit 500 may be configured by a mixer which mixes the first delayed signal OUT1 and the second delayed signal OUT2 at the mixing ratio of 1:1.

The initial delay monitoring circuit 600 is configured to generate the switching control signal SW, the coarse initial delay information and the fine initial delay information S3 in response to the internally delayed signals of the first loop circuit 200, that is, the plurality of unit delayed signals udly<1:n−1>, the clock signal ICLK and initial operation period signals int, intb and int2.

Here, the coarse initial delay information includes the first coarse initial delay information S1 and the second coarse initial delay information S2.

The initial operation setting unit 700 is configured to generate the initial operation period signals int, intb and int2 in response to the clock signal ICLK and an operation start signal, for example, a power-up signal PWRUP.

A semiconductor integrated circuit starts to operate when the power-up signal PWRUP is activated. Therefore, according to an exemplary embodiment of the present invention, the power-up signal PWRUP is used as an operation start signal for instructing the synchronization circuit 100 to start an operation.

Hereafter, an initial delay time setting operation of the synchronization circuit 100 in accordance with an embodiment of the present invention will be described with reference to FIG. 1.

When the initial operation period signal int is activated, the coarse delay line 210 receives and delays the feedback signal FEDCLK. The first delay control signals dlycnt<1:n> which are outputted from the shift register 250 are set initially to a certain logic value.

The certain logic value is a logic value which allows the coarse delay line 210 to generate the unit delayed signals udly<1:n−1> of n−1 bits using the feedback signal FEDCLK and to generate an $n^{th}$ unit delayed signal, that is, the first pre-delayed signal OUT1_PRE using the clock signal ICLK. The unit delayed signals udly<1:n−1> are transferred to the initial delay monitoring circuit 600. The initial delay monitoring circuit 600 compares the phase of each of n−1 number of unit delayed signals udly<1:n−1> and the clock signal ICLK, and generates the first coarse initial delay information S1 and the second coarse initial delay information S2 according to the phase information of the clock signal ICLK and the feedback signal FEDCLK. Further, according to an example, the initial delay monitoring circuit 600 generates the fine initial delay information S3 using the first coarse initial delay information S1 during the activation period of the initial operation period signal int2.

When the first coarse initial delay information S1 and the second coarse initial delay information S2 are respectively inputted to the shift registers 250 and 350 in a state in which the initial operation period signal int is activated, the shift registers 250 and 350 output the first coarse initial delay information S1 and the second coarse initial delay information S2 as the first delay control signals dlycnt<1:n> and dlycnt2<1:n>, respectively.

The initial delay times of the coarse delay lines 210 and 310 are set according to the first delay control signals dlycnt<1:n> and dlycnt2<1:n>.

Also, initial mixing ratios of the fine mixers 260 and 360 are set according to the fine initial delay information S3. That is to say, initial delay times are set.

As a result, in a state in which the phase difference between the clock signal ICLK and the feedback signal FEDCLK is minimized initially, operations of the first loop circuit 200 and the second loop circuit 300 can be started, and accordingly, a time required for completion of delay locking can be shortened.

Figure 2A:
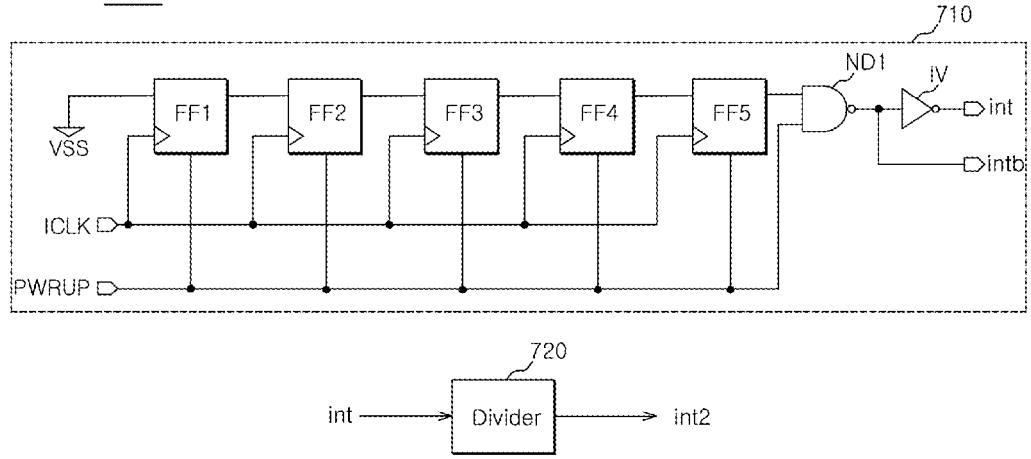
FIG. 2a is a circuit diagram of an initial operation setting unit 700 of FIG. 1.
Figure 2A:
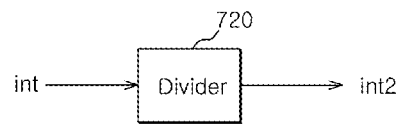

Referring to FIG. 2a, the initial operation setting unit 700 includes a shift section 710 and a divider 720.

The shift section 710 includes first, second, . . . , and fifth flip-flops FF1, FF2, . . . , and FF5. Also, the shift section 710 includes a NAND gate ND1 and an inverter IV.

The first, second, . . . , and fifth flip-flops FF1, FF2, . . . , and FF5 are connected in series, and each of the fifth flip-flops is initialized by the power-up signal PWRUP to output signals of a high level. Also, each of the first, second, . . . , and fifth flip-flops FF1, FF2, . . . , and FF5 receives and latches the output signal of previous flip-flop in response to the clock signal ICLK. The first flip-flop FF1, which is arranged at the front end, receives ground power VSS. The NAND gate ND1 receives the output signal of the fifth flip-flop FF5 and the power-up signal PWRUP. The inverter IV receives the output signal of the NAND gate ND1 and outputs the initial operation period signals int and intb.

If the clock signal ICLK toggles after the power-up signal PWRUP is activated, and the fifth flip-flop FF5 outputs a high level signal, the initial operation period signal int is activated to a high level. Because the ground power VSS is transferred to the NAND gate ND1, according to an example, after the clock signal ICLK toggles 5 times, the initial operation period signal int maintains an activation period for 5 cycles of the clock signal ICLK.

The divider 720 is configured to divide the initial operation period signal int by a preset division ratio and generate the initial operation period signal int2.

The division ratio of the divider 720 may vary in proportion to the bit number of the fine initial delay information S3.

Figure 2B:
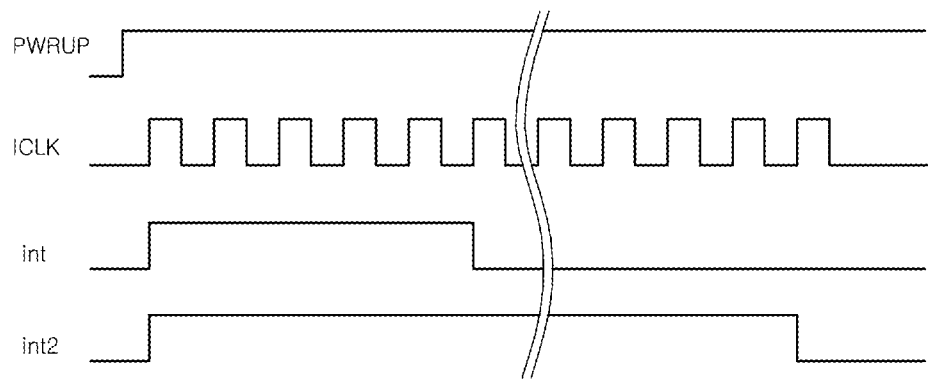

The waveforms of the power-up signal PWRUP, the clock signal ICLK and the initial operation period signals int and int2 are shown in FIG. 2b.

As will be described later, in an embodiment of the present invention, after the first coarse initial delay information S1 and the second coarse initial delay information S2 are generated, the fine initial delay information S3 is generated.

The initial operation period signal int may represent the completion of adjustments of the first coarse initial delay information S1 and the second coarse initial delay information S2, and the initial operation period signal int2 may represent the completion of adjustment of the fine initial delay information S3.

A period through which the initial operation period signal int is activated may be determined in such a way as to include a time for the replica delay 230 to generate the feedback signal FEDCLK in an initial operation and a time for the initial delay monitoring circuit 600 to generate the first coarse initial delay information S1 and the second coarse initial delay information S2.

The initial operation period signal intb is a signal which has a phase opposite to the initial operation period signal int.

The initial operation period signal int2 is activated at the same timing as the initial operation period signal int. The activation period of the initial operation period signal int2 may be determined in such a way as to include a time for the initial delay monitoring circuit 600 to generate the fine initial delay information S3 using the first coarse initial delay information S1.

Accordingly, the activation period of the initial operation period signal int2 is set to be longer than the initial operation period signal int.

While, according to an exemplary embodiment of the present invention, the initial operation period signal int is activated during 5 cycles of the clock signal ICLK, it is to be noted that the activation period of the initial operation period signal int may vary by increasing or decreasing the number of flip-flops depending upon circumstances and conditions.

Figure 3:
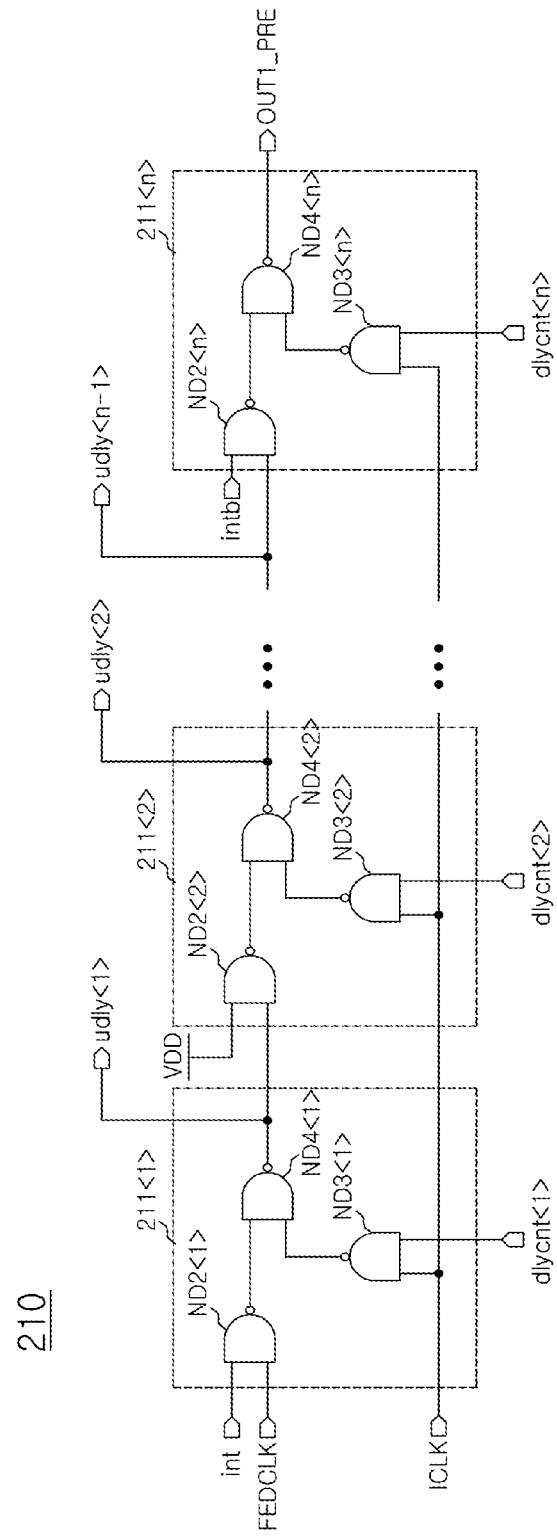
FIG. 3 is a circuit diagram of the coarse delay line 210 of FIG. 1.

Referring to FIG. 3, the coarse delay line 210 includes n number of unit delay sections 211<1:n> which are connected in series.

The respective unit delay sections 211<1:n> include a plurality of NAND gates ND2<1:n>, ND3<1:n> and ND4<1:n>. The NAND gate ND2<1> of the unit delay section 211<1> arranged at the front end of the coarse delay line 210 receives the initial operation period signal int and the feedback signal FEDCLK. The NAND gates ND2<2:n−1> of the second to n−1$^{st}$ unit delay sections 211<2:n−1> respectively receive the output signals of the previous unit delay sections 211<1:n−2> and external supply power VDD. The NAND gate ND2<n> of the unit delay section 211<n> arranged at the back end of the coarse delay line 210 receives the initial operation period signal intb and the output signal of another unit delay section 211<n−1>.

Each of n number of NAND gates ND3<1:n> arranged in the respective unit delay sections 211<1:n> receives one corresponding bit of the first delay control signals dlycnt<1:n> and the clock signal ICLK. n number of NAND gates ND4<1:n> receive the output signals of the NAND gates ND2<1:n> and the output signals of the NAND gates ND3<1:n>, and output the plurality of unit delayed signals udly<1:n−1> and the first pre-delayed signal OUT1_PRE.

In the coarse delay line 210 configured in this way, the first delay control signals dlycnt<1:n>, at the activation timing of the initial operation period signal int, have specified values (for example, 0, 0, . . . , 1). The feedback signal FEDCLK is inputted to the NAND gate ND2<1> of the first unit delay section 211<1>, is then delayed while passing through n−1 number of unit delay sections 211<1:n−1>, and is outputted as n−1 number of unit delayed signals udly<1:n−1>. Since the output signal of the NAND gate ND2<n> of the n$^{th}$ unit delay section 211<n> has a high level, the clock signal ICLK is delayed by the delay time of the NAND gate ND3<n> of the n$^{th}$ unit delay section 211<n> and is outputted as the first pre-delayed signal OUT1_PRE.

Figure 4:
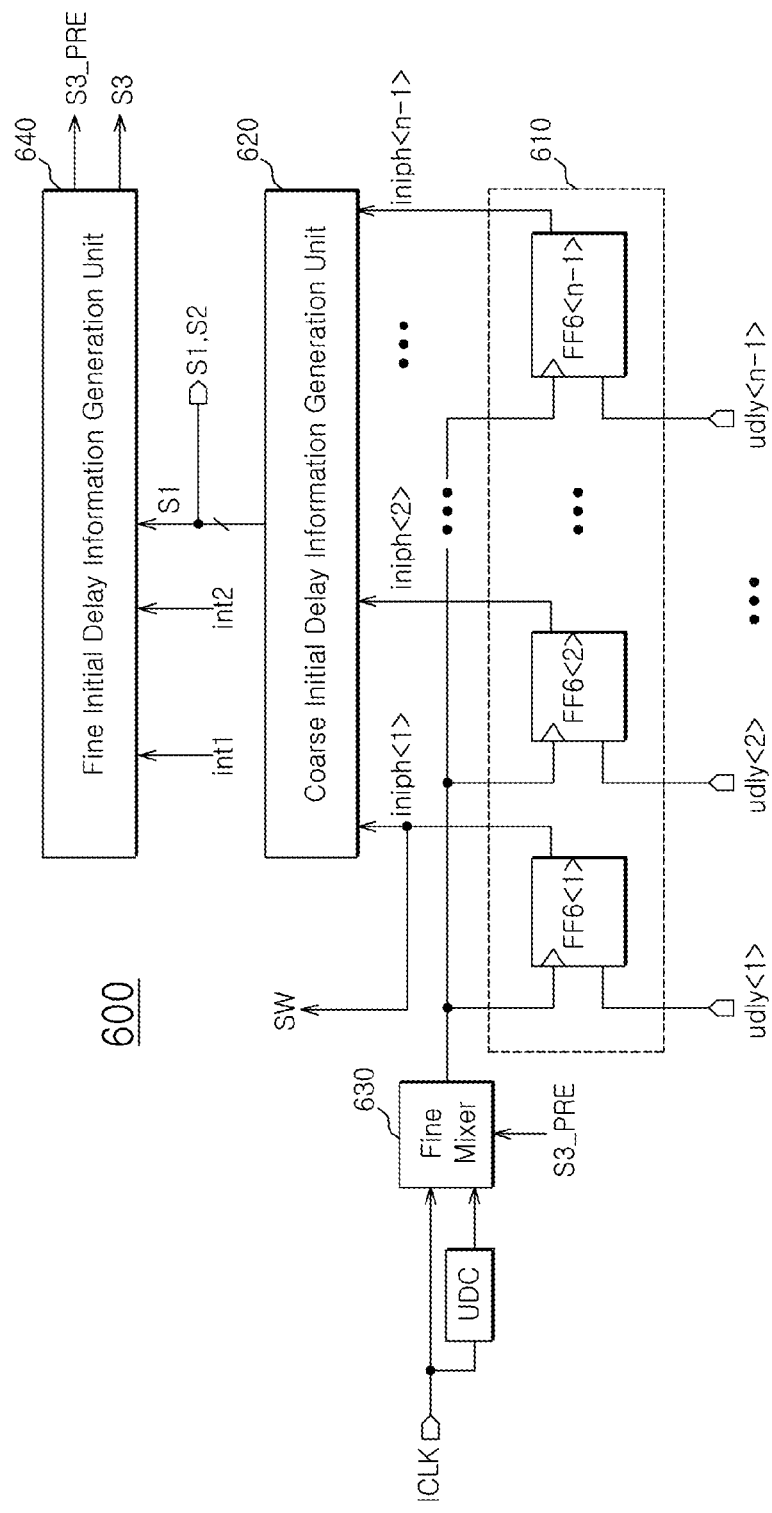
FIG. 4 is a block diagram showing the internal configuration of an initial delay monitoring circuit 600 of FIG. 1.

Referring to FIG. 4, the initial delay monitoring circuit 600 includes an initial phase information extraction unit 610, a coarse initial delay information generation unit 620, a unit delay UDC, a fine mixer 630, and a fine initial delay information generation unit 640.

The initial delay monitoring circuit 600 samples the n−1-bit unit delayed signals udly<1:n−1> using a sampling signal and generates the first coarse initial delay information S1 and the second coarse initial delay information S2. Also, the initial delay monitoring circuit 600 finely delays the sampling signal in the same manner as in the fine mixer 260 with the delay time of the coarse delay line 210 locked, detect a change of the first coarse initial delay information S1, and generates the fine initial delay information S3. The clock signal ICLK may be used as the sampling signal.

The initial phase information extraction unit 610 is configured to compare the phases of the clock signal ICLK and the n−1-bit unit delayed signals udly<1:n−1> and generate initial phase signals iniph<1:n−1>.

The initial phase information extraction unit 610 includes n−1 number of flip-flops FF6<1:n−1> which are connected in series. The respective flip-flops FF6<1:n−1> perform a function of latching respective bits of the n−1 number of unit delayed signals udly<1:n−1> in response to the clock signal ICLK, and output the initial phase signals iniph<1:n−1>.

By the initial phase information extraction unit 610, the initial phase information of the feedback signal FEDCLK and the clock signal ICLK is reflected on the logic values of the initial phase signals iniph<1:n−1>.

The first coarse initial delay information S1 and the second coarse initial delay information S2 may be set to include only one signals having a logic value of '1' at different positions.

The coarse initial delay information generation unit 620 is configured to decode the initial phase signals iniph<1:n−1> and generate the first coarse initial delay information S1 and the second coarse initial delay information S2.

The initial phase signal iniph<1> with an earliest timing among the initial phase signals iniph<1:n−1> may be provided to the switching unit 400 as the switching control signal SW.

Also, the coarse initial delay information generation unit 620 is configured to detect the phase differences of the clock signal ICLK and the plurality of unit delayed signals udly<1:n−1>, and generate the first coarse initial delay information S1.

The coarse initial delay information generation unit 620 is configured to detect the phase differences of the clock signal ICLK and the plurality of unit delayed signals udly<1:n−1> and a low pulse width TLOW of the clock signal ICLK and generate the second coarse initial delay information S2.

The first coarse initial delay information S1 is information which causes a delay time TDLL corresponding to the phase difference between the clock signal ICLK and the feedback signal FEDCLK to be set in the coarse delay line 210.

The second coarse initial delay information S2 is information which causes a delay time TDLL+TLOW corresponding to the summation of the delay time TDLL and the low pulse width TLOW of the clock signal ICLK to be set in the coarse delay line 310.

The fine mixer 630 is configured to mix the clock signal ICLK and the output signal of the unit delay UDC at a mixing ratio varying in response to preliminary fine initial delay information S3_PRE and output a resultant signal.

The fine mixer 630 may vary the delay time of the clock signal ICLK by varying the mixing ratio of the clock signal ICLK and the output signal of the unit delay UDC.

Also, the fine mixer 630 may be designed in the same manner as the fine mixer 260. The unit delay time of the fine mixer 630 is set to be shorter than the unit delay time of the coarse delay line 210.

The fine initial delay information generation unit 640 is configured to generate the fine initial delay information S3 and the preliminary fine initial delay information S3_PRE in response to the initial operation period signals int and int2 and the first coarse initial delay information S1.

Here, the fine initial delay information S3 is information for setting the initial delay times of the fine mixers 260 and 360.

Figure 5:
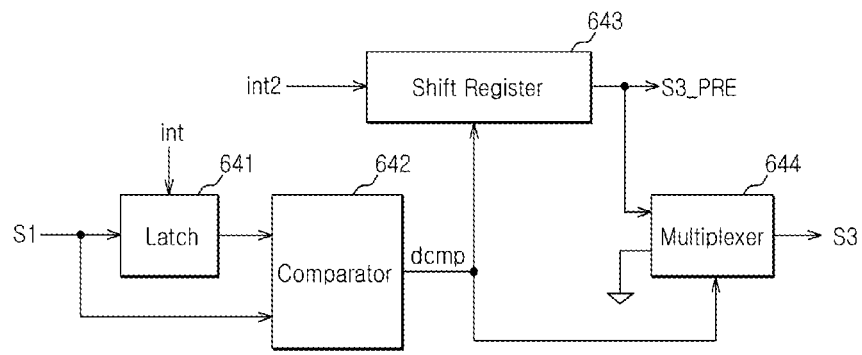
FIG. 5 is a block diagram showing the internal configuration of a fine initial delay information generation unit 640 of FIG. 4.

Referring to FIG. 5, the fine initial delay information generation unit 640 includes a latch 641, a comparator 642, a shift register 643, and a multiplexer 644.

The latch 641 is configured to latch the first coarse initial delay information S1 in response to the initial operation period signal int.

The latch 641 latches the first coarse initial delay information S1 in response to the falling edge of the initial operation period signal int.

The initial operation period signal int is, according to an example, a signal which represents the completion of operations for generating the first coarse initial delay information S1 and the second coarse initial delay information S2, that is, a signal which notifies that control of the first coarse initial delay information S1 and the second coarse initial delay information S2 is completed. The falling edge of the initial operation period signal int may represent the completion of adjustments of the first coarse initial delay information S1 and the second coarse initial delay information S2, that is, a completion of coarse locking.

The comparator 642 is configured to compare the latched first coarse initial delay information S1 and the first coarse initial delay information S1, and generate a comparison signal dcmp.

The shift register 643 is configured to change the preliminary fine initial delay information S3_PRE in response to the initial operation period signal int2 and the comparison signal dcmp.

The shift register 643 changes the preliminary fine initial delay information S3_PRE in the case where the comparison signal dcmp is logic low during the activation period (for example, the logic high period) of the initial operation period signal int2.

Also, the shift register 643 maintains the value of the preliminary fine initial delay information S3_PRE in a current state in the case where the comparison signal dcmp is logic high.

If the initial operation period signal int2 is deactivated, that is, becomes logic low, the shift register 643 maintains the preliminary fine initial delay information S3_PRE, regardless of the comparison signal dcmp.

The multiplexer 644 is configured to selectively output the preliminary fine initial delay information S3_PRE or a logic low level, as the fine initial delay information S3, in response to the comparison signal dcmp.

The multiplexer 644 outputs a signal of which each bit is logic low as the fine initial delay information S3 if fine locking is not completed, that is, the comparison signal dcmp is logic low.

Also, the multiplexer 644 outputs the preliminary fine initial delay information S3_PRE as the fine initial delay information S3 if fine locking is completed, that is, the comparison signal dcmp is logic high.

In an initial operation, since fine locking is not completed, the comparison signal dcmp of a logic low level is outputted, and accordingly, the multiplexer 644 outputs the signal of which each bit is logic low, as the fine initial delay information S3.

Therefore, the fine mixer 260 bypasses and outputs the first pre-delayed signal OUT1_PRE as the first delayed signal OUT1.

As described above, in the state in which the delay time of the coarse delay line 210 is locked, as the fine mixer 630 gradually adjusts the delay time of the clock signal ICLK, the value of the first coarse initial delay information S1 changes at a certain timing.

However, the value of the latched first coarse initial delay information S1 is retained regardless of the operation of the fine mixer 630.

Changing of the value of the first coarse initial delay information S1 means that the phase difference between the clock signal ICLK and the feedback signal FEDCLK decreases below the unit delay time of the fine mixer 630, i.e., fine locking of the clock signal ICLK and the feedback signal FEDCLK is completed.

Thus, if the value of the first coarse initial delay information S1 changes and becomes different from the value of the latched first coarse initial delay information S1, the comparator 642 transitions the comparison signal dcmp to a logic level different from a previous logic level (for example, to a logic high level).

Since fine locking is completed, that is, the comparison signal dcmp is logic high, the multiplexer 644 outputs the fine-locked preliminary fine initial delay information S3_PRE as the fine initial delay information S3.

Figure 6:
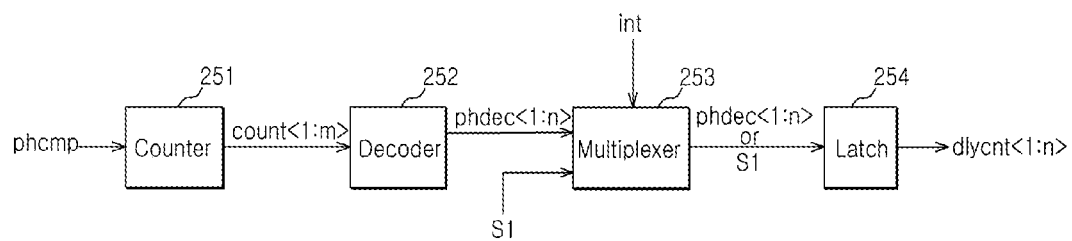
FIG. 6 is a block diagram showing the internal configuration of a shift register 250 of FIG. 1.

Referring to FIG. 6, the shift register 250 includes a counter 251 configured to perform a counting operation in response to the phase comparison signal dcmp and output count signals count<1:m> of m bits, a decoder 252 configured to decode the count signals count<1:m> of m bits and output decoding signals phdec<1:n>, a multiplexer 253 configured to selectively output the decoding signals phdec<1:n> or the first coarse initial delay information S1 in response to the initial operation period signal int, and a latch 254 configured to latch the output signal of the multiplexer 253 and output the first delay control signals dlycnt<1:n>.

The counter 251 increases or decreases the logic values of the count signals count<1:m> of m bits according to the phase comparison signal phcmp. Here, it may be understood that the counter 251 increases or decreases the logic values of the count signals count<1:m> according to the phase information of the clock signal ICLK and the feedback signal FEDCLK. Thereafter, the decoder 252 decodes the count signals count<1:m> of m bits and outputs the decoding signals phdec<1:n>. The decoding signals phdec<1:n> may have a value in such a type that only one bit of them has the logic value of '1'. The decoding signals phdec<1:n> may be realized in such a manner that the logic value of '1' is moved by one cipher as the logic values of the count signals count<1:m> of m bits change.

If the initial operation period signal int is activated, the multiplexer 253 blocks the decoding signals phdec<1:n> and passes the first coarse initial delay information S1. At this time, the logic values of the first delay control signals dlycnt<1:n> are set to specified values (for example, 0, 0, . . . , 1) in the latch 254. Thereafter, when the first coarse initial delay information S1 is inputted to the latch 254, the latch 254 latches the first coarse initial delay information S1 and thereby outputs the first delay control signals dlycnt<1:n>. In other words, during the initial operation period according to the initial operation period signal int, the first coarse initial delay information S1 is outputted as the first delay control signals dlycnt<1:n>. The coarse delay line 210 applies a delay time for minimizing the phase difference between the clock signal ICLK and the feedback signal FEDCLK, to the clock signal ICLK in response to the first coarse initial delay information S1.

Then, if the initial operation period signal int is deactivated, the multiplexer 253 blocks the first coarse initial delay information S1 and passes the decoding signals phdec<1:n>. Thereafter, the latch 254 latches the decoding signals phdec<1:n> and thereby outputs the first delay control signals dlycnt<1:n>. At this time, since the phase difference between the clock signal ICLK and the feedback signal FEDCLK is not so substantial, the logic values of the decoding signals phdec<1:n> will approximate to the logic values of the first coarse initial delay information S1. Accordingly, even though the logic values of the first delay control signals dlycnt<1:n> and the decoding signals phdec<1:n> vary in response to the phase comparison signal phcmp, time taken until the logic values of the first delay control signals dlycnt<1:n> are locked may decrease.

Figure 7:
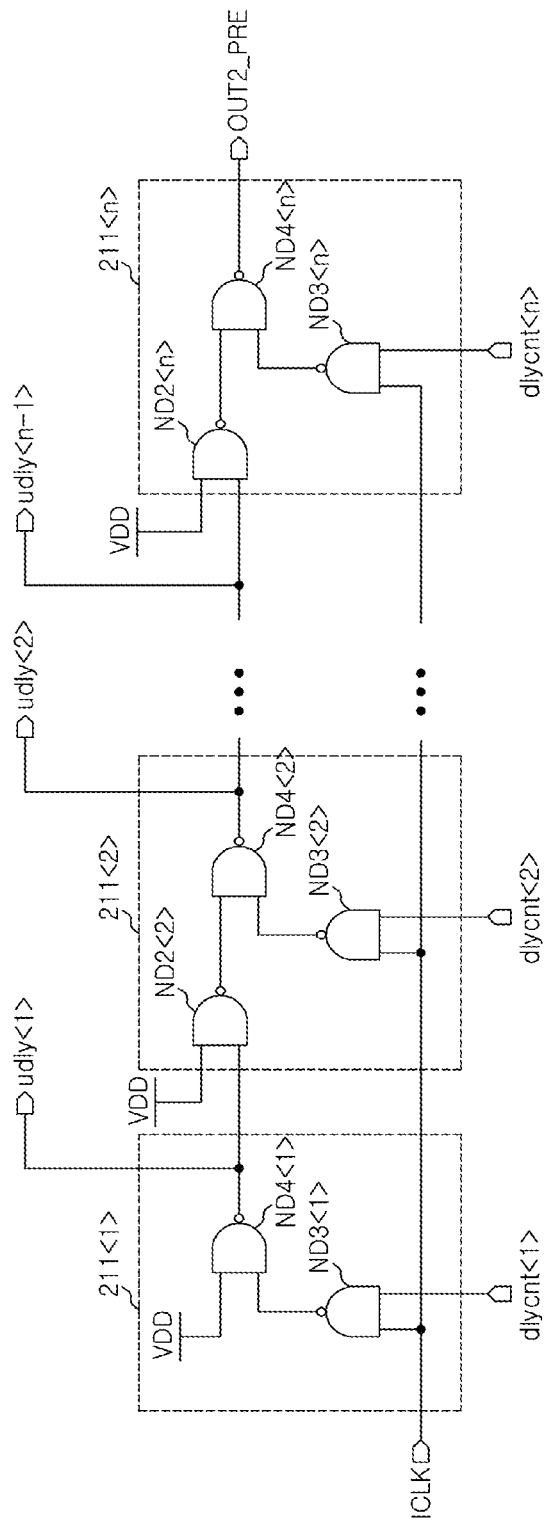
FIG. 7 is a circuit diagram of a coarse delay line 310 of FIG. 1.

The coarse delay line 310 of the second loop circuit 300 may be configured as shown in FIG. 7 in such a manner that the NAND gate ND2<1> is removed from the configuration of the coarse delay line 210 shown in FIG. 3, and the external supply power VDD is inputted to a NAND gate ND4<1> and is inputted to a NAND gate ND2<n> instead of the initial operation period signal intb.

Figure 8:
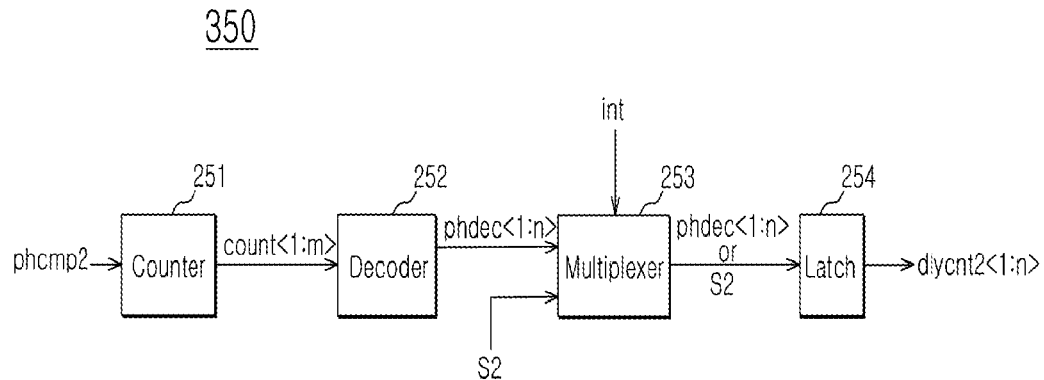
FIG. 8 is a block diagram showing the internal configuration of a shift register 350 of FIG. 1.

Referring to FIG. 8, the shift register 350 of the second loop circuit 300 may be configured in the same way as the shift register 250 shown in FIG. 6 except that the second coarse initial delay information S2 is inputted to the multiplexer 253.

Operations of the synchronization circuit 100 in accordance with an embodiment of the present invention, configured as mentioned above, will be described below with reference to FIGS. 9a and 9b.

In an embodiment of the present invention, the switching unit 400 is configured to enable a half cycle (half tCK) operation.

Namely, in the case where the delay time TDLL corresponding to the phase difference between the clock signal ICLK and the feedback signal FEDCLK is longer than the half cycle of the clock signal ICLK, the clock bar signal ICLKB is inputted to the first loop circuit 200 as the first input signal IN1, and the clock signal ICLK is inputted to the second loop circuit 300 as the second input signal IN2.

Accordingly, the first loop circuit 200 may operate using two signals, that is, the clock bar signal ICLKB and the feedback signal FEDCLK, which have a phase difference no longer than the half cycle of the clock signal ICLK.

Of course, in the case where the delay time TDLL corresponding to the phase difference between the clock signal ICLK and the feedback signal FEDCLK is no longer than the half cycle of the clock signal ICLK, the clock signal ICLK is inputted to the first loop circuit 200 as the first input signal IN1, and the clock bar signal ICLKB is inputted to the second loop circuit 300 as the second input signal IN2.

Further, as a signal for determining whether or not the delay time TDLL is longer than the half cycle of the clock signal ICLK and for controlling the switching unit 400, the switching control signal SW, that is, the initial phase signal iniph<1> may be used.

In the case where the phase difference between the clock signal ICLK and the feedback signal FEDCLK is no longer than the half cycle of the clock signal ICLK, the initial phase signal iniph<1> is outputted at a high level. That is to say, the switching control signal SW becomes logic high.

In the case where the phase difference between the clock signal ICLK and the feedback signal FEDCLK is longer than the half cycle of the clock signal ICLK, the initial phase signal iniph<1> is outputted at a low level. That is to say, the switching control signal SW becomes logic low.

The initial delay monitoring circuit 600 shown in FIG. 4 generates the first coarse initial delay information S1, the second coarse initial delay information S2 and the fine initial delay information S3 according to the switching control signal SW which determines whether or not the delay time TDLL corresponding to the phase difference between the clock signal ICLK and the feedback signal FEDCLK is longer than the half cycle of the clock signal ICLK.

Figure 9A:
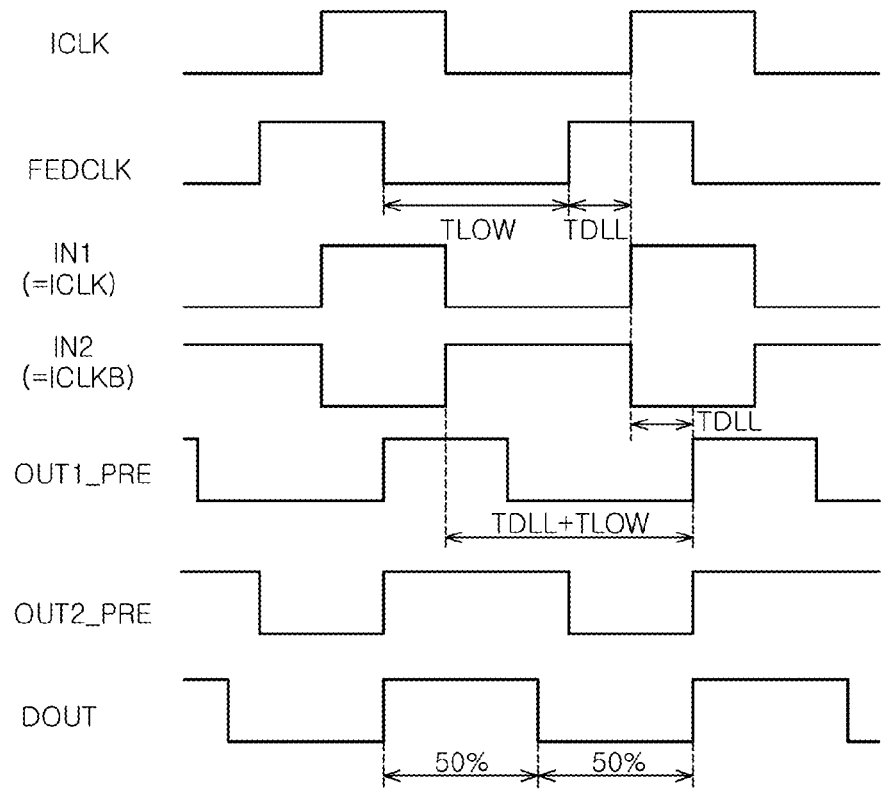
FIGS. 9a and 9b are timing diagrams illustrating operations of the synchronization circuit in accordance with an embodiment of the present invention.

Referring to FIG. 9a, in the case where the phase difference between the clock signal ICLK and the feedback signal FEDCLK is no longer than the half cycle of the clock signal ICLK, the initial phase signals iniph<1:n−1> become a type of '1, 1, . . . , 0, 0, . . . , 1, 1, . . . '. Since the initial phase signal iniph<1> has a high level, the switching control signal SW of a logic high level is outputted.

The number of bits consecutively having the value of '1' among the initial phase signals iniph<1:n−1> may represent the delay time TDLL corresponding to the phase difference between the clock signal ICLK and the feedback signal FEDCLK. Accordingly, the coarse initial delay information generation unit 620 shown in FIG. 4 generates the first coarse initial delay information S1 which has logic values for setting the delay time of the coarse delay line 210 to the delay time TDLL, using the bits consecutively having the value of '1' among the initial phase signals iniph<1:n−1>.

Also, the number of bits consecutively having the value of '0' among the initial phase signals iniph<1:n−1> may represent the low pulse width TLOW of the clock signal ICLK. At this time, duty cycle correction is implemented by mixing the clock bar signal ICLKB delayed by the low pulse width TLOW of the clock signal ICLK and the clock signal ICLK. Hence, the coarse initial delay information generation unit 620 shown in FIG. 4 generates the second coarse initial delay information S2 which has logic values for setting the delay time of the coarse delay line 310 to the delay time TDLL+TLOW, using the bits consecutively having the value of '0' among the initial phase signals iniph<1:n−1>.

The fine initial delay information generation unit 640 shown in FIG. 4 generates the fine initial delay information S3.

Accordingly, the clock signal ICLK is inputted to the first loop circuit 200 as the first input signal IN1, and the clock bar signal ICLKB is inputted to the second loop circuit 300 as the second input signal IN2.

The initial delay time of the coarse delay line 210 of the first loop circuit 200 is set according to the first coarse initial delay information S1, the initial delay time of the coarse delay line 310 of the second loop circuit 300 is set according to the second coarse initial delay information S2, and the initial delay times of the fine mixers 260 and 360 are set according to the fine initial delay information S3.

The first pre-delayed signal OUT1_PRE is a signal which is acquired by actually delaying the clock signal ICLK by TDLL, and the second pre-delayed signal OUT2_PRE is a signal which is acquired by actually delaying the clock bar signal ICLKB by TDLL+TLOW.

As described above, duty cycle correction is implemented by mixing the clock bar signal ICLKB delayed by the low pulse width TLOW of the clock signal ICLK and the clock signal ICLK.

Thus, as the duty cycle compensation unit 500 mixes the first delayed signal OUT1 and the second delayed signal OUT2 at a mixing ratio of 1:1, the delay-locked and duty cycle-compensated output signal DOUT is generated.

Figure 9B:
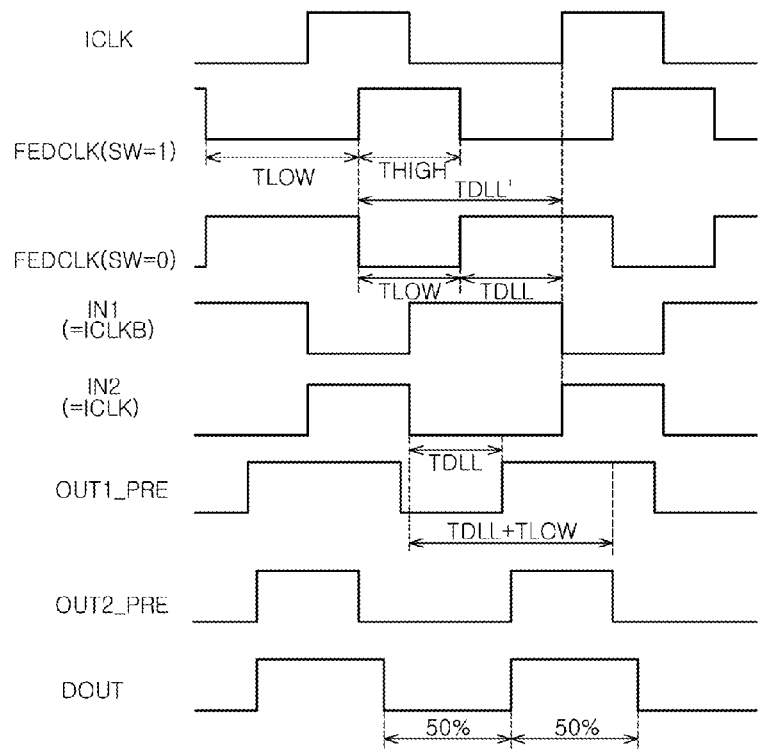

Referring to FIG. 9*b*, in the case where the phase difference between the clock signal ICLK and the feedback signal FEDCLK is longer than the half cycle of the clock signal ICLK, the initial phase signals iniph<1:n−1> become a type of '0, 0, . . . , 1, 1, . . . , 0, 0, . . . '. Since the initial phase signal iniph<1> has a low level, the switching control signal SW of a logic low level is outputted.

Since the switching control signal SW is logic low, after the first coarse initial delay information S1, the second coarse initial delay information S2 and the fine initial delay information S3 are set, the clock bar signal ICLKB is inputted to the first loop circuit 200 as the first input signal IN1, and the clock signal ICLK is inputted to the second loop circuit 300 as the second input signal IN2.

In other words, the clock bar signal ICLKB is controlled according to the first coarse initial delay information S1.

Therefore, as shown in FIG. 9*b*, in the case where the switching control signal SW is logic low, TLOW and TDLL of the feedback signal FEDCLK to be actually acquired respectively correspond to THIGH and TDLL'−THIGH of the feedback signal FEDCLK in the case where the switching control signal SW is logic high.

The number of bits consecutively having the value of '0' among the initial phase signals iniph<1:n−1> may represent the delay time TDLL corresponding to the phase difference between the clock signal ICLK and the feedback signal FEDCLK. Accordingly, the coarse initial delay information generation unit 620 shown in FIG. 4 generates the first coarse initial delay information S1 which has logic values for setting the delay time of the coarse delay line 210 to the delay time TDLL, using the bits consecutively having the value of '0' among the initial phase signals iniph<1:n−1>.

The number of bits consecutively having the value of '1' among the initial phase signals iniph<1:n−1> may represent the low pulse width TLOW of the clock signal ICLK. Here, duty cycle correction is implemented by mixing the clock bar signal ICLKB delayed by the low pulse width TLOW of the clock signal ICLK and the clock signal ICLK. Hence, the coarse initial delay information generation unit 620 shown in FIG. 4 generates the second coarse initial delay information S2 which has logic values for setting the delay time of the coarse delay line 310 to the delay time TDLL+TLOW, using the bits consecutively having the value of '1' among the initial phase signals iniph<1:n−1>.

The fine initial delay information generation unit 640 shown in FIG. 4 generates the fine initial delay information S3.

After the first coarse initial delay information S1, the second coarse initial delay information S2 and the fine initial delay information S3 are generated in these ways, the clock bar signal ICLKB is inputted to the first loop circuit 200 as the first input signal IN1, and the clock signal ICLK is inputted to the second loop circuit 300 as the second input signal IN2, according to the switching control signal SW of logic low.

In the case where the initial operation period signal int is deactivated, the shift registers 250 and 350 do not receive the first coarse initial delay information S1 and the second coarse initial delay information S2, and control the operations of the coarse delay lines 210 and 310 while changing the logic values of the first delay control signals dlycnt<1:n> in response to the respective phase comparison signals phcmp and phcmp2.

The coarse delay line 210 does not receive the feedback signal FEDCLK and performs an operation of delaying the clock signal ICLK under the control of the first delay control signals dlycnt<1:n>.

The first delayed signal OUT1 and the second delayed signal OUT2 are generated by the operations of the first loop circuit 200 and the second loop circuit 300, and the delay-locked and duty cycle-compensated output signal DOUT is generated by the duty cycle compensation unit 500.

As is apparent from the above descriptions, by the synchronization circuit according to an embodiment of the present invention, times required for a delay locking operation and a duty cycle compensating operation can be shortened.

While certain embodiments have been described above, it will be understood to those skilled in the art that the embodiments described are by way of example only. Accordingly, the synchronization circuit described herein should not be limited based on the described embodiments. Rather, the synchronization circuit described herein should only be limited in light of the claims that follow when taken in conjunction with the above description and accompanying drawings.

What is claimed is:

1. A synchronization circuit comprising:
    a first delay unit configured to delay an input signal by a delay time corresponding to first initial delay information and generate a pre-delayed signal;

a second delay unit configured to delay the pre-delayed signal by a delay time corresponding to second initial delay information and generate a delayed signal; and an initial delay monitoring circuit configured to generate the first initial delay information and the second initial delay information in response to internal delayed signals of the first delay unit and the input signal.

2. The synchronization circuit according to claim 1, wherein a unit delay time of the second delay unit is set to be shorter than a unit delay time of the first delay unit.

3. The synchronization circuit according to claim 1, further comprising:
a shift register configured to set the delay time of the first delay unit in response to the first initial delay information.

4. The synchronization circuit according to claim 1, further comprising:
an initial operation setting unit configured to generate initial operation period signals in response to the input signal and an operation start signal.

5. The synchronization circuit according to claim 1, further comprising:
a replica delay configured to delay the delayed signal by a preset time and generate a feedback signal.

6. The synchronization circuit according to claim 5, wherein the first delay unit is configured to delay the feedback signal and generate the internal delayed signals.

7. The synchronization circuit according to claim 1, wherein the initial delay monitoring circuit is configured to detect phase differences between the input signal and the internal delayed signals and generate the first initial delay information.

8. The synchronization circuit according to claim 1, wherein the initial delay monitoring circuit is configured to delay the input signal with the delay time of the first delay unit locked, detect a corresponding change in the first initial delay information, and generate the second initial delay information.

9. The synchronization circuit according to claim 1, wherein the initial delay monitoring circuit comprises:
a fine mixer configured to delay by a predetermined delay time and output the input signal in response to preliminary initial delay information;
a first initial delay information generation unit configured to decode phase differences between an output signal of the fine mixer and the internal delayed signals and generate the first initial delay information; and
a second initial delay information generation unit configured to detect a change in the first initial delay information according to a change of the preliminary initial delay information, and output the preliminary initial delay information at a time when the change in the first initial delay information is detected, as the second initial delay information.

10. The synchronization circuit according to claim 9, wherein the fine mixer is configured in the same manner as the second delay unit.

11. The synchronization circuit according to claim 9, wherein the second initial delay information generation unit comprises:
a latch configured to latch the first initial delay information of which the change is completed;
a comparator configured to compare first initial delay information latched by the latch and the first initial delay information and generate a comparison signal;
a shift register configured to change the preliminary initial delay information in response to the comparison signal; and
a multiplexer configured to output the preliminary initial delay information as the second initial delay information in response to the comparison signal.

12. The synchronization circuit according to claim 1, wherein the initial delay monitoring circuit is configured to output the second initial delay information with a preset value to the second delay unit until generation of the second initial delay information is completed.

13. A synchronization circuit comprising:
a first loop circuit configured to adjust a delay time of a first input signal in response to first coarse initial delay information and fine initial delay information, and generate a first delayed signal;
a second loop circuit configured to adjust a delay time of a second input signal by a preset initial delay time in response to second coarse initial delay information and the fine initial delay information, and generate a second delayed signal;
a duty cycle compensation unit configured to compensate for a duty cycle of the first delayed signal using the second delayed signal; and
an initial delay monitoring circuit configured to generate the first coarse initial delay information, the second coarse initial delay information and the fine initial delay information in response to internal delayed signals of the first loop circuit and the first input signal.

14. The synchronization circuit according to claim 13, further comprising:
an initial operation setting unit configured to generate a first initial operation period signal and a second initial operation period signal in response to the first input signal and an operation start signal.

15. The synchronization circuit according to claim 14, wherein the first loop circuit comprises:
a first delay unit configured to delay the first input signal and generate a first pre-delayed signal;
a second delay unit configured to delay the first pre-delayed signal by a delay time in response to the fine initial delay information and generate a first delayed signal;
a replica delay configured to delay the first delayed signal by a preset time and generate a feedback signal; and
a shift register configured to set a delay time of the first delay unit in response to the first initial operation period signal and the first coarse initial delay information.

16. The synchronization circuit according to claim 14, wherein the second loop circuit comprises:
a first delay unit configured to delay the second input signal and generate a second pre-delayed signal;
a second delay unit configured to delay the second pre-delayed signal by a delay time in response to the fine initial delay information and generate a second delayed signal; and
a shift register configured to set a delay time of the first delay unit in response to the first initial operation period signal and the second coarse initial delay information.

17. The synchronization circuit according to claim 13, wherein the duty cycle compensation unit comprises a mixer configured to mix the first delayed signal and the second delayed signal.

18. The synchronization circuit according to claim 13, wherein the initial delay monitoring circuit is configured to detect phase differences between the first input signal and the internal delayed signals and generate the first coarse initial delay information, and detect phase differences between the first input signal and the internal delayed signals and a row pulse width of the first input signal and generate the second coarse initial delay information.

19. The synchronization circuit according to claim 13, wherein the initial delay monitoring circuit is configured to detect a change in the first coarse initial delay information with the delay time of the first loop circuit locked and generate the fine initial delay information.

20. The synchronization circuit according to claim 13, wherein the initial delay monitoring circuit comprises:
   a fine mixer configured to delay by a predetermined delay time and output the first input signal in response to preliminary initial delay information;
   a coarse initial delay information generation unit configured to decode phase difference information between an output signal of the fine mixer and the internal delayed signals and generate the first coarse initial delay information and the second coarse initial delay information; and
   a fine initial delay information generation unit configured to detect a change in the first coarse initial delay information according to a change of the preliminary initial delay information, and output the preliminary initial delay information at a time when the change in the first coarse initial delay information is detected, as the fine initial delay information.

21. The synchronization circuit according to claim 20, wherein the initial delay monitoring circuit further comprises:
   an initial phase information extraction unit configured to compare phases of the output signal of the fine mixer and the internal delayed signals and generate the phase difference information, and output one bit of signal bits of the phase difference information as a switching control signal.

22. The synchronization circuit according to claim 20, wherein the fine initial delay information generation unit comprises:
   a latch configured to latch the first coarse initial delay information of which the change is completed;
   a comparator configured to compare first coarse initial delay information latched by the latch and the first coarse initial delay information and generate a comparison signal;
   a shift register configured to change the preliminary initial delay information in response to the comparison signal; and
   a multiplexer configured to output the preliminary initial delay information as the fine initial delay information in response to the comparison signal.

23. The synchronization circuit according to claim 21, further comprising:
   a switching unit configured to output a clock signal or a clock bar signal as the first input signal or the second input signal in response to the switching control signal.

* * * * *